United States Patent
Zeng et al.

(10) Patent No.: US 12,255,452 B1
(45) Date of Patent: Mar. 18, 2025

(54) METHOD AND DEVICE FOR CONSTRUCTING DYNAMIC SECURITY REGION OF POWER GRID BASED ON EXTENDED PHASE TRAJECTORY THEORY

(71) Applicant: Tianjin University, Tianjin (CN)

(72) Inventors: Yuan Zeng, Tianjin (CN); Haosen Cao, Tianjin (CN); Chao Qin, Tianjin (CN); Yuzhuo Hu, Tianjin (CN); Junzhi Ren, Tianjin (CN)

(73) Assignee: Tianjin University, Tianjin (CN)

( * ) Notice: Subject to any disclaimer, the term of this patent is extended or adjusted under 35 U.S.C. 154(b) by 11 days.

(21) Appl. No.: 18/813,931

(22) Filed: Aug. 23, 2024

(51) Int. Cl.
  *H02J 3/38* (2006.01)
  *G01R 31/08* (2020.01)
  *H02J 3/00* (2006.01)

(52) U.S. Cl.
  CPC .......... *H02J 3/0012* (2020.01); *G01R 31/088* (2013.01); *H02J 3/38* (2013.01)

(58) Field of Classification Search
  CPC .......... H02J 3/0012; H02J 3/38; G01R 31/088
  See application file for complete search history.

(56) References Cited

U.S. PATENT DOCUMENTS

| | | | |
|---|---|---|---|
| 9,368,967 | B1 | 6/2016 | Vedder |
| 9,991,705 | B2 | 6/2018 | Quadrini |
| 10,243,361 | B2 | 3/2019 | Raghunathan |
| 2015/0310366 | A1* | 10/2015 | Yu .......... G06Q 50/06 705/7.22 |
| 2018/0323644 | A1* | 11/2018 | Jia .......... H02J 3/242 |
| 2024/0230743 | A1* | 7/2024 | Tian .......... H02J 3/36 |

FOREIGN PATENT DOCUMENTS

| | | | | |
|---|---|---|---|---|
| CN | 106936131 | A | * | 7/2017 |
| CN | 111654038 | A | * | 9/2020 ................ H02J 3/24 |

* cited by examiner

*Primary Examiner* — Mohamed Charioui
*Assistant Examiner* — Xiuqin Sun

(57) ABSTRACT

A method for constructing a dynamic security region of a power grid based on an extended phase trajectory theory includes: obtaining a system transient stability condition and a power angle leading generator group by transient simulation of an initial operation point of a system; for generators in the leading generator group A, changing output of each of the generators to search for a dominant instability critical point; calculating the reciprocal of the slope of the tangent line of the trajectory of n swings of an extended phase plane based on angular velocity-angular acceleration in a fourth quadrant, and changing a small disturbance output of the generator at the dominant instability critical point to solve a sensitivity of the extended phase trajectory; and constructing a multi-modal practical dynamic security region based on the extended phase trajectory.

7 Claims, 2 Drawing Sheets

METHOD AND DEVICE FOR CONSTRUCTING DYNAMIC SECURITY REGION OF POWER GRID BASED ON EXTENDED PHASE TRAJECTORY THEORY

CROSS-REFERENCE TO RELATED APPLICATIONS

This application claims priority to Chinese Patent Application No. 202410110301.3 with a filing date of Jan. 25, 2024. The content of the aforementioned application, including any intervening amendments thereto, is incorporated herein by reference.

TECHNICAL FIELD

The present disclosure relates to a method and a device for constructing a dynamic security region of a power grid based on an extended phase trajectory theory, and belongs to the technical field of circuit system analysis.

BACKGROUND

The safe and stable operation of an electric power system is a common global issue related to economic development and social stability, and has been highly concerned by electric power industry personnel around the world over the years. With the continuous expansion of the power grid interconnection and the rapid development of the electric power market, the power grid has shown more complex dynamic characteristics, which bring new challenges to the safe, stable and reliable operation of the electric power system.

At present, major electric power accidents that seriously endanger social production and life all come from the lack of transient security and stability. The long-term operation practice of the electric power system shows that the occurrence of large-scale power outages always results from the loss of the transient stability of the system. Therefore, studying a rapid and reliable transient stability analysis method to characterize the limit state of the system near instability is of great significance for real-time monitoring of the safe and stable operation of the power grid.

SUMMARY

In view of the above, the present disclosure provides a method and a device for constructing a dynamic security region of a power grid based on an extended phase trajectory theory, which can judge the system stability under a multi-instability modal scenario and provide a more accurate security region boundary characterization scheme for the transient stability analysis of an electric power system.

To achieve the above objective, the present disclosure provides the following technical solutions: a method for constructing a dynamic security region of a power grid based on an extended phase trajectory theory comprises:
acquiring electric power system data, where the electric power system data comprises a power angle $\delta$ and an angular velocity difference $\Delta\omega$ of a generator node after a fault occurs, identifying a leading generator group A through the power angle $\delta$, and performing Complementary Cluster Center of Inertia-Relative Motion (CCCOI-RM) transformation on the angular velocity difference $\Delta\omega$ to obtain a transformed angular acceleration $\gamma$;
for generators in the leading generator group A, changing output of each of the generators to search for a dominant instability critical point;
calculating a reciprocal of the slope of the tangent line of a trajectory of n swings of an extended phase plane based on angular velocity-angular acceleration in a fourth quadrant according to actual measurement information to obtain a stability index for identifying single-swing instability and multi-swing instability, and changing a disturbance output $\Delta P$ of the generator at the dominant instability critical point to solve a sensitivity of the extended phase trajectory; and
constructing a multi-modal practical dynamic security region based on the extended phase trajectory based on upper and lower output limits of the generator and an output limit of a balancing machine.

According to a preferred solution of the method for constructing the dynamic security region of the power grid based on the extended phase trajectory theory, a formula of performing CCCOI-RM transformation on the angular velocity difference $\Delta\omega$ to obtain the transformed angular acceleration is as follows:

$$\begin{cases} \Delta\tilde{\omega}_i = \Delta\omega_i - \Delta\omega_{COI} \\ \Delta\omega_{COI} = \dfrac{1}{M_T}\sum_{i=1}^{n} M_i \Delta\omega_i \\ M_T = \sum_{i=1}^{n} M_i \end{cases}$$

where $\Delta\tilde{\omega}_i$ is an angular velocity deviation of an $i^{th}$ generator relative to COI, $\Delta\omega_i$ is an angular velocity deviation of the $i^{th}$ generator, $\Delta\omega_{COI}$ is an angular velocity deviation based on the COI, $M_T$ is a sum of inertia time constants of n generators, and $M_i$ is an inertia time constant of the $i^{th}$ generator.

According to a preferred solution of the method for constructing the dynamic security region of the power grid based on the extended phase trajectory theory, for generators in the leading generator group A, the process of changing output of each of the generators to search for a dominant instability critical point is as follows:
if the electric power system is in transient instability when the fault duration time is t, obtaining a power angle table and an angular velocity table of the electric power system;
drawing an extended phase trajectory of angular velocity and angular acceleration according to the power angle table and the angular velocity table of the electric power system, dividing the electric power system into a leading generator group A and a lagging generator group S according to an unstable power angle curve of the electric power system when a power angle between generators is greater than a threshold of 180°, and after the output of the generators in the leading generator group A is adjusted, performing transient simulation again until the electric power system is in the transient stability and a stable operation point $P_0$ is obtained; and
increasing the output of the generator i in the leading generator group A to an upper output limit of the generator i at the stable operation point $P_0$, performing transient simulation again, if the electric power system is in transient instability, searching for a critical instability point by adopting a dichotomy method, and marking the critical instability point as a dominant instability critical point of the generator.

According to a preferred solution of the method for constructing the dynamic security region of the power grid based on the extended phase trajectory theory, a formula of calculating the reciprocal of the slope of the tangent line of the trajectory of n swings of the extended phase plane based on angular velocity-angular acceleration in the fourth quadrant according to actual measurement information to obtain a stability index f for identifying single-swing instability and multi-swing instability is as follows:

$$f = \max\left\{ \frac{\Delta\omega^1}{D_\gamma^1} \quad \frac{\Delta\omega^2}{D_\gamma^2} \quad \cdots \quad \frac{\Delta\omega^n}{D_\gamma^n} \right\} < 0$$

where $\Delta\omega^i/D_\gamma^i$ is a negative reciprocal of the slope of the tangent line of the trajectory of the $i^{th}$ swing in the fourth quadrant, $D_\gamma$ is an intercept value of the tangent line of the trajectory of the extended phase plane in the fourth quadrant on $\gamma$ axis, and the stability of the system is judged by judging the sign of f when the $i^{th}$ swing leaves the fourth quadrant.

According to a preferred solution of the method for constructing the dynamic security region of the power grid based on the extended phase trajectory theory, the method further includes correcting the stability index f, where a formula of judging the corrected transient stability is as follows:

$$f(\Delta\omega_{min}, D_\gamma) = \frac{\Delta\omega_{min}}{\gamma - \frac{dt}{d\gamma} \sqsubset \Delta\omega_{min}} = \frac{dt}{In\left(\frac{\Delta\omega_{min}}{-\gamma}\right)} < 0$$

where $\Delta\omega_{min}$ is a value of the angular velocity difference when the trajectory of the min extended phase plane is currently swung out of the fourth quadrant, and $\gamma$ is the transformed angular acceleration.

According to a preferred solution of the method for constructing the dynamic security region of the power grid based on the extended phase trajectory theory, the method further includes performing injection power sensitivity analysis on a multi-modal instability correction criterion based on an extended phase trajectory to obtain an effective mapping between the correction criteria and node injection power, and defining an extended phase trajectory sensitivity matrix S as follows:

$$S = \left[\frac{\partial f_i}{\partial P_j}\right] i \in A, j = 1, 2$$

where when a change in the output of the generator is $\Delta P = [\Delta P_1, \Delta P_2, \ldots \Delta P_n]$, a formula of judging the extended phase trajectory stability is as follows:

$f_i + S\Delta P < 0$ by introducing the upper and lower active output limits of the generator and the output limit of the balancing machine, an extended phase trajectory formula is expressed as follows:

$$-\frac{1}{f_i} \sum_{j=1}^{n} \frac{\partial f_i}{\partial P_j} \Delta P_j < 1 \quad i = 1, 2 \ldots n$$

a change in the output of the balancing machine is as follows:

$$\Delta P_s = -\sum_{j=1}^{n} \Delta P_j$$

according to the change $\Delta f_i$ in the extended phase trajectory correction criterion, a sensitivity $S_j$ of the stability criterion of the generator i to the generator j is as follows:

$$S_j = \frac{\Delta f_i}{\Delta P_j} - \frac{\Delta f_i}{\Delta P_s}$$

the expression of the dominant security region of the generator i is as follows:

$$-\frac{1}{f_i} \sum_{j=1}^{n-1} \left(\frac{\partial f_i}{\partial P_j} - \frac{\partial f_i}{\partial P_s}\right) \Delta P_j < 1$$

where $f_i=[f_1, f_2, \ldots f_n]$ is a stability index of the leading generator group A, and the extended phase trajectory $f_i$ at the dominant critical point of the generator i changes the disturbance $\Delta P_j$; and $P_j$ is the injection power of all generator nodes.

According to a preferred solution of the method for constructing the dynamic security region of the power grid based on the extended phase trajectory theory, a formula of constructing a multi-modal practical dynamic security region based on the extended phase trajectory based on upper and lower output limits of the generator and an output limit of a balancing machine is as follows:

$$\begin{cases} -\frac{1}{f_i} \sum_{j=1}^{n-1} \left(\frac{\partial f_i}{\partial P_j} - \frac{\partial f_i}{\partial P_s}\right) \Delta P_j < 1 \\ P_j^m - P_j \leq \Delta P_j \leq P_j^M - P_j \\ P_s^m - P_s \leq -\sum_{j=1}^{n-1} \Delta P_j \leq P_s^M - P_s \end{cases}$$

where $P_s$ is an active output of a balancing machine group, $P_j^m$ is a lower limit of the active power of the $j^{th}$ generator, $P_j^M$ is an upper limit of the active power of the $j^{th}$ generator, $P_s^m$ is a lower limit of the active power of the balancing machine, and $P_s^M$ is an upper limit of the active power of the balancing machine.

The present disclosure further provides a device for constructing a dynamic security region of a power grid based on an extended phase trajectory theory, which comprises:

a data acquisition module, configured to acquire electric power system data, where the electric power system data comprises a power angle $\delta$ and an angular velocity difference $\Delta\omega$ of a generator node after a fault occurs, identify a leading generator group A through the power angle $\delta$, and perform CCCOI-RM transformation on the angular velocity difference $\Delta\omega$ to obtain a transformed angular acceleration $\gamma$;

an instability analysis module, configured to change output of each of generators in the leading generator group A to search for a dominant instability critical point;

a sensitivity calculation module, configured to calculate a reciprocal of the slope of the tangent line of a trajectory of n swings of an extended phase plane based on angular velocity-angular acceleration in a fourth quadrant according to actual measurement information to obtain a stability index for identifying single-swing instability and multi-swing instability, and change a disturbance output ΔP of the generator at the dominant instability critical point to solve a sensitivity of the extended phase trajectory; and a security region construction module, configured to construct a multi-modal practical dynamic security region based on the extended phase trajectory based on upper and lower output limits of the generator and an output limit of a balancing machine.

According to a preferred solution of the device for constructing the dynamic security region of the power grid based on the extended phase trajectory theory, in the data acquisition module, a formula of performing CCCOI-RM transformation on the angular velocity difference Δω to obtain the transformed angular acceleration is as follows:

$$\begin{cases} \Delta\tilde{\omega}_i = \Delta\omega_i - \Delta\omega_{COI} \\ \Delta\omega_{COI} = \frac{1}{M_T} \sum_{i=1}^{n} M_i \Delta\omega_i \\ M_T = \sum_{i=1}^{n} M_i \end{cases}$$

where $\Delta\tilde{\omega}_i$ is an angular velocity deviation of an $i^{th}$ generator relative to COI, $\Delta\omega_i$ is an angular velocity deviation of the $i^{th}$ generator, $\Delta\omega_{COI}$ is an angular velocity deviation based on the COI, $M_T$ is a sum of inertia time constants of n generators, and $M_i$ is an inertia time constant of the $i^{th}$ generator.

According to a preferred solution of the device for constructing the dynamic security region of the power grid based on the extended phase trajectory theory, the instability analysis module comprises:

a table acquisition submodule, configured to obtain a power angle table and an angular velocity table of the electric power system if the electric power system is in transient instability when the fault duration time is t;

a stable operation point analysis submodule, configured to draw an extended phase trajectory of angular velocity and angular acceleration according to the power angle table and the angular velocity table of the electric power system, divide the electric power system into a leading generator group A and a lagging generator group S according to an unstable power angle curve of the electric power system when a power angle between generators is greater than a threshold of 180°, and after the output of the generators in the leading generator group A is adjusted, perform transient simulation again until the electric power system is in the transient stability and a stable operation point $P_0$ is obtained; and a critical instability point analysis submodule, configured to increase the output of the generator i in the leading generator group A to an upper output limit of the generator i at the stable operation point $P_0$, perform transient simulation again, if the electric power system is in transient instability, search for a critical instability point by adopting a dichotomy method, and mark the critical instability point as a dominant instability critical point of the generator.

According to a preferred solution of the device for constructing the dynamic security region of the power grid based on the extended phase trajectory theory, in the sensitivity calculation module, a formula of calculating the reciprocal of the slope of the tangent line of the trajectory of n swings of the extended phase plane based on angular velocity-angular acceleration in the fourth quadrant according to actual measurement information to obtain the stability index f for identifying single-swing instability and multi-swing instability is as follows:

$$f = \max\left\{\frac{\Delta\omega^1}{D_\gamma^1}, \frac{\Delta\omega^2}{D_\gamma^2}, \ldots, \frac{\Delta\omega^n}{D_\gamma^n}\right\} < 0$$

where $\Delta\omega^i/D_\gamma^i$ is a negative reciprocal of the slope of the tangent line of the trajectory of the $i^{th}$ swing in the fourth quadrant, $D^\gamma$ is an intercept value of the tangent line of the trajectory of the extended phase plane in the fourth quadrant on γ axis, and the stability of the system is judged by judging the sign of f when the $i^{th}$ swing leaves the fourth quadrant;

in the sensitivity calculation module, the stability index f is corrected, and a formula of judging the corrected transient stability is as follows:

$$f(\Delta\omega_{min}, D_\gamma) = \frac{\Delta\omega_{min}}{\gamma - \frac{dt}{\gamma}\sqsubset \Delta\omega_{min}} = \frac{dt}{In\left(\frac{\Delta\omega_{min}}{-\gamma}\right)} < 0$$

where $\Delta\omega_{min}$ is a value of the angular velocity difference when the trajectory of the extended phase plane is currently swung out of the fourth quadrant, and γ is the transformed angular acceleration;

in the sensitivity calculation module, the injection power sensitivity analysis is performed on a multi-modal instability correction criterion based on an extended phase trajectory to obtain an effective mapping between the correction criteria and node injection power, and an extended phase trajectory sensitivity matrix S is defined as follows:

$$S = \left[\frac{\partial f_i}{\partial P_j}\right] i \in A, j = 1, 2$$

in the sensitivity calculation module, when the change in the output of the generator is $\Delta P = [\Delta P_1, \Delta P_2, \ldots \Delta P_n]$, a formula of judging the extended phase trajectory stability is as follows:

$$f_i + S\Delta P < 0$$

in the sensitivity calculation module, by introducing the upper and lower active output limits of the generator and the output limit of the balancing machine, an extended phase trajectory formula is expressed as follows:

$$-\frac{1}{f_i}\sum_{j=1}^{n}\frac{\partial f_i}{\partial P_j}\Delta P_j < 1 \quad i = 1, 2 \ldots n$$

in the sensitivity calculation module, the change in the output of the balancing machine is as follows:

$$\Delta P_s = -\sum_{j=1}^{n} \Delta P_j$$

in the sensitivity calculation module, according to the change $\Delta f_i$ in the extended phase trajectory correction criterion, a sensitivity $S_j$ of the stability criterion of the generator i to the generator j is as follows:

$$S_j = \frac{\Delta f_i}{\Delta P_j} - \frac{\Delta f_i}{\Delta P_s}$$

in the sensitivity calculation module, the expression of the dominant security region of the generator i is as follows:

$$-\frac{1}{f_i} \sum_{j=1}^{n-1} \left( \frac{\partial f_i}{\partial P_j} - \frac{\partial f_i}{\partial P_s} \right) \Delta P_j < 1$$

where $f_i = [f_1, f_2, \ldots f_n]$ is a stability index of the leading generator group A, and the extended phase trajectory $f_i$ at the dominant critical point of the generator i changes the disturbance $\Delta P_j$; and $P_j$ is the injection power of all generator nodes.

According to a preferred solution of the device for constructing the dynamic security region of the power grid based on the extended phase trajectory theory, in the security region construction module, a formula of constructing a multi-modal practical dynamic security region based on the extended phase trajectory based on upper and lower output limits of the generator and an output limit of a balancing machine is as follows:

$$\begin{cases} -\frac{1}{f_i} \sum_{j=1}^{n-1} \left( \frac{\partial f_i}{\partial P_j} - \frac{\partial f_i}{\partial P_s} \right) \Delta P_j < 1 \\ P_j^m - P_j \leq \Delta P_j \leq P_j^M - P_j \\ P_s^m - P_s \leq -\sum_{j=1}^{n-1} \Delta P_j \leq P_s^M - P_s \end{cases}$$

where $P_s$ is an active output of a balancing machine group, $P_j^m$ is a lower limit of the active power of the $j^{th}$ generator, $P_j^M$ is an upper limit of the active power of the $j^{th}$ generator, $P_s^m$ is a lower limit of the active power of the balancing machine, and $P_s^M$ is an upper limit of the active power of the balancing machine.

The present disclosure has the following advantages: electric power system data is acquired, where the electric power system data comprises a power angle $\delta$ and an angular velocity difference $\Delta\omega$ of a generator node after a fault occurs; a leading generator group A is identified through the power angle $\delta$, and CCCOI-RM transformation is performed on the angular velocity difference $\Delta\omega$ to obtain the transformed angular acceleration $\gamma$; for generators in the leading generator group A, output of each of the generators is changed to search for a dominant instability critical point; a reciprocal of the slope of the tangent line of a trajectory of n swings of an extended phase plane based on angular velocity-angular acceleration in a fourth quadrant is calculated according to actual measurement information to obtain a stability index for identifying single-swing instability and multi-swing instability, and a disturbance output $\Delta P$ of the generator is changed at the dominant instability critical point to solve a sensitivity of the extended phase trajectory; and a multi-modal practical dynamic security region based on the extended phase trajectory is constructed based on upper and lower output limits of the generator and an output limit of a balancing machine. The present disclosure achieves the stability judgment of the single-swing instability and multi-swing instability of the system, expands the application range compared with the traditional extended phase trajectory, and breaks through the limitation that the stability of the traditional trajectory stability judgment cannot quantify the stability margin through the combination with the security region. The present disclosure achieves an effective mapping between the correction criterion and the dynamic security region, and simultaneously construct a dynamic security region at the critical stable point by utilizing the sensitivity matrix. Compared with the traditional phase trajectory sensitivity, the stability criterion sensitivity constructed by the present disclosure has a constant coefficient characteristic that does not require measurement data, fully utilizes the margin quantization capability of a security region, obtains the linear relation between the stability criterion and the node injection power, and can achieve accurate transient stability evaluation before a fault occurs.

BRIEF DESCRIPTION OF DRAWINGS

To more clearly illustrate the technical solutions in the embodiments of the present disclosure or in the prior art, the accompanying drawings required to be used in the description of the embodiments or the prior art will be briefly introduced below. Clearly, the accompanying drawings in the following descriptions are merely exemplary. Those of ordinary skill in the art may still derive other implementation drawings from these provided accompanying drawings without creative efforts.

DETAILED DESCRIPTION

The following is an explanation of the implementation of the present disclosure by specific embodiments. Those skilled in the art can easily understand other advantages and effects of the present disclosure from the contents disclosed in this specification. It is clear that the described embodiments are some but not all of embodiments of the present disclosure. Based on the embodiments of the present disclosure, all other embodiments obtained by those of ordinary skill in the art without creative effort fall within the protection scope of the present disclosure.

In the related technology, a phasor measurement unit and a wide area measurement system of an electric power system are more and more widely applied, and a new idea is provided for the research of the online transient stability analysis method. When an electric power system suffers from large disturbance and transient instability occurs, the response trajectory of the system in a phase plane shows the characteristics of geometric changes. Based on this, the present disclosure provides the stability criterion of the phase plane trajectory of the power angle-angular velocity and the angular velocity-angular acceleration, achieves the accurate judgment of the stable state of the system before the unstable trajectory crosses a dynamic saddle point, and avoids the transient stability analysis of elaborate system modeling and complex model solving. The following is a detailed description of embodiments of the present disclosure.

Embodiment 1

Figure 1:
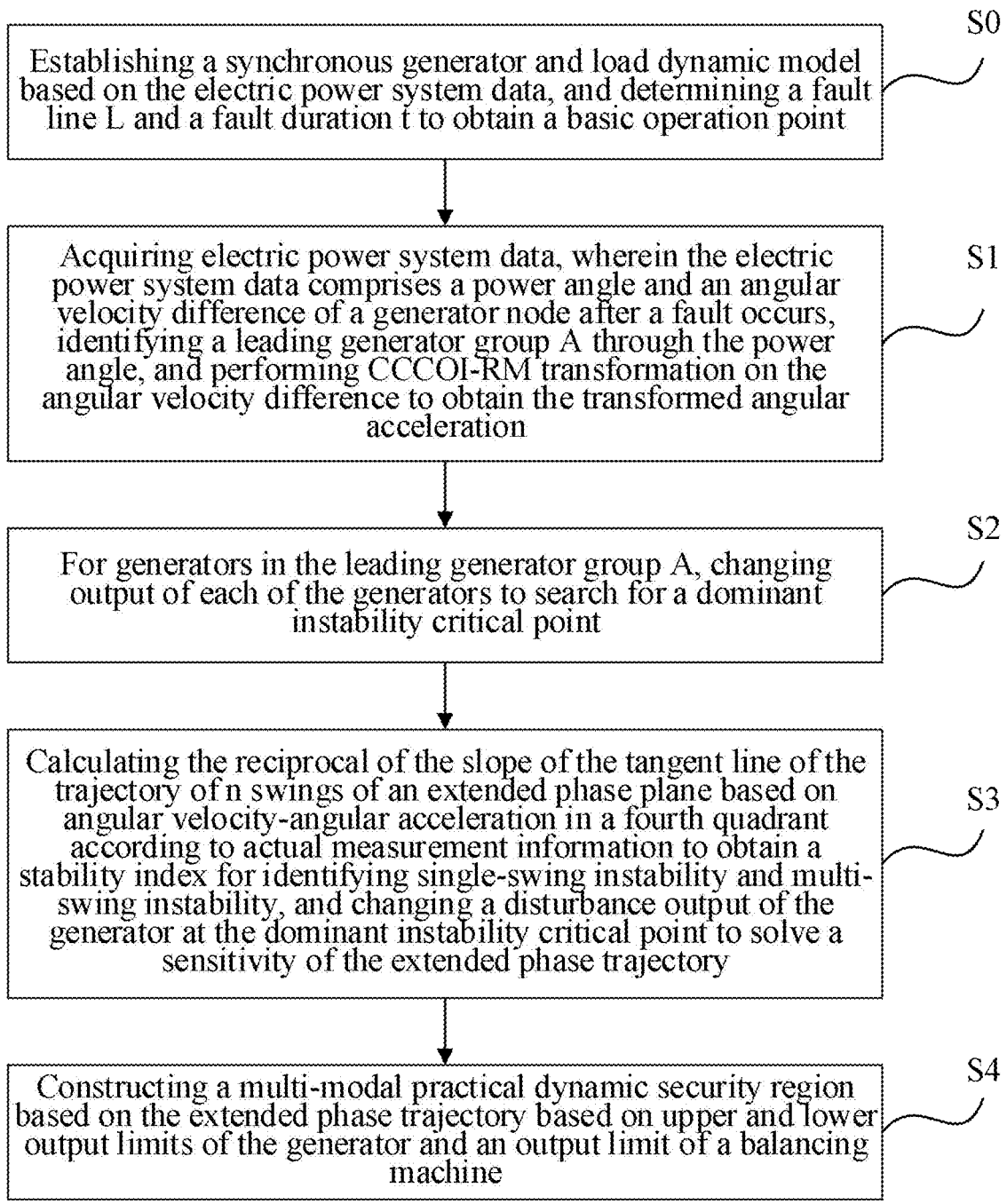
FIG. 1 is a schematic flow chart of a method for constructing a dynamic security region of a power grid based on an extended phase trajectory theory according to an embodiment of the present disclosure.

Referring to FIG. 1, Embodiment 1 of the present disclosure provides a method for constructing a dynamic security region of a power grid based on an extended phase trajectory theory, which comprises the following steps:

S0: establishing a synchronous generator and load dynamic model based on the electric power system data, and determining a fault line L and a fault duration t to obtain a basic operation point;

S1: acquiring electric power system data, where the electric power system data comprises a power angle $\delta$ and an angular velocity difference $\Delta\omega$ of a generator node after a fault occurs, identifying a leading generator group A through the power angle $\delta$, and performing CCCOI-RM transformation on the angular velocity difference $\Delta\omega$ to obtain a transformed angular acceleration $\gamma$;

S2: for generators in the leading generator group A, changing output of each of the generators to search for a dominant instability critical point;

S3: calculating a reciprocal of the slope of the tangent line of a trajectory of n swings of an extended phase plane based on angular velocity-angular acceleration in a fourth quadrant according to actual measurement information to obtain a stability index for identifying single-swing instability and multi-swing instability, and changing a disturbance output $\Delta P$ of the generator at the dominant instability critical point to solve a sensitivity of the extended phase trajectory; and S4: constructing a multi-modal practical dynamic security region based on the extended phase trajectory based on upper and lower output limits of the generator and an output limit of a balancing machine.

In this embodiment, in the step S0, a process of establishing a synchronous generator and load dynamic model, and determining a fault line L and a fault duration t to obtain a basic operation point is as follows:

specifically, the IEEE39-node system, a classic transient stability instance, is used as an example to verify the effectiveness of the method, the fault line L is selected as a three-phase grounding short circuit of the lines 17-18, and the fault is removed within 0.15 s.

In this embodiment, in the step S1, real-time operation data of the power angle $\delta$ and the angular velocity difference $\Delta\omega$ of the generator node after the fault is obtained from an actual electric power system; coherent generator groups of a leading generator group A and a lagging generator group S are identified through power angles, CCCOI-RM transformation is further performed on the $\Delta\omega$, and the transformed angular acceleration $\gamma$ is calculated; where the CCCOI-RM transformation is performed on the angular velocity difference $\Delta\omega$, and a formula of obtaining the transformed angular acceleration is as follows:

$$\begin{cases} \Delta\tilde{\omega}_i = \Delta\omega_i - \Delta\omega_{COI} \\ \Delta\omega_{COI} = \frac{1}{M_T}\sum_{i=1}^{n}M_i\Delta\omega_i \\ M_T = \sum_{i=1}^{n}M_i \end{cases}$$

where $\Delta\tilde{\omega}_i$ is an angular velocity deviation of an $i^{th}$ generator relative to COI, $\Delta\omega_i$ is an angular velocity deviation of the $i^{th}$ generator, $\Delta\omega_{COI}$ is an angular velocity deviation based on the COI, $M_T$ is a sum of inertia time constants of n generators, and $M_i$ is an inertia time constant of the $i^{th}$ generator.

In this embodiment, in the step S2, if the electric power system is in transient instability when the fault duration time is t, a power angle table and an angular velocity table of the electric power system are obtained;

an extended phase trajectory of angular velocity and angular acceleration is drawn according to the power angle table and the angular velocity table of the electric power system, the electric power system is divided into a leading generator group A and a lagging generator group S according to an unstable power angle curve of the electric power system when a power angle between generators is greater than a threshold of 180°, and after the output of the generators in the leading generator group A is adjusted, transient simulation is performed again until the electric power system is in the transient stability and a stable operation point $P_0$ is obtained; and the output of the generator i in the leading generator group A is increased to an upper output limit of the generator i at the stable operation point $P_0$, transient simulation is performed again, if the electric power system is in transient instability, a critical instability point is searched by adopting a dichotomy method, and the critical instability point is marked as a dominant instability critical point of the generator.

In this embodiment, in the step S3, after the primary swing of the electric power system is stabilized at the critical point of the dominant instability determined in the step S2, when the damping of the electric power system is severely insufficient, the unbalanced energy of the electric power system during oscillation gradually increases, and at the end of the kinetic energy reduction phase of the $n^{th}$ swing, the angular velocity of the rotor has not decreased to 0, and multi-swing instability occurs. Through the complementary cluster center of inertia-relative motion transformation of the measured response trajectory of generator groups, the multi-generator electric power system can be equivalently transformed into a single-generator infinite system. Combined with the characteristics that each entry and exit of the trajectory on the extended phase plane into and out of the fourth quadrant represents the beginning and end of the kinetic energy reduction phase, it can be seen that the trajectory of the last swing of the multi-swing instability on the extended phase plane is to leave the fourth quadrant from the positive half axis of the $\omega$ axis and diverge in the upper right corner of the first quadrant.

Specifically, for systems with different instability modes, the stability of the system can be judged by the positive and negative signs of the negative tangent slope $D_\gamma/\Delta\omega$ of the trajectory in the fourth quadrant. By calculating the maximum value of the negative reciprocal $\Delta\omega/D_\gamma$ of the slope of the tangent line of the trajectory of the extended phase plane in the fourth quadrant after the trajectory of the extended phase plane has passed n swings, the stability index f of the single-swing and multi-swing instability of the system can be accurately judged to be less than 0 after correction, and $D_\gamma$ is the intercept value of the tangent line of the trajectory in the fourth quadrant on $\gamma$ axis, where:

$$f = \max\left\{\frac{\Delta\omega^1}{D_\gamma^1} \quad \frac{\Delta\omega^2}{D_\gamma^2} \quad \cdots \quad \frac{\Delta\omega^n}{D_\gamma^n}\right\} < 0$$

where $\Delta\omega^i/D_\gamma^i$ is a negative reciprocal of the slope of the tangent line of the trajectory of the $i^{th}$ swing in the fourth quadrant, $D_\gamma$ is an intercept value of the tangent line of the trajectory of the extended phase plane in the fourth quadrant on $\gamma$ axis, and the stability of the system is judged by judging the sign of f when the $i^{th}$ swing leaves the fourth quadrant;

Since the rate of change of the slope of the trajectory in the fourth quadrant is monotone, the stability of the system can be determined by judging the sign of f where the $i^{th}$ swing leaves the fourth quadrant. A formula for judging the corrected transient stability is as follows:

$$f(\Delta\omega_{min}, D_\gamma) = \frac{\Delta\omega_{min}}{\gamma - \frac{dt}{\gamma} \sqsubset \Delta\omega_{min}} = \frac{dt}{\ln\left(\frac{\Delta\omega_{min}}{-\gamma}\right)} < 0$$

where $\Delta\omega_{min}$ is a value of the angular velocity difference when the trajectory of the extended phase plane is currently swung out of the fourth quadrant, and $\gamma$ is the transformed angular acceleration.

For a stable system, the trajectory reduces with each swing, and f reaches the maximum value at the first swing. For an unstable system, $\Delta\omega_{min}/D_\gamma$ is greater than 0 only at the last swing, so that f reaches the maximum value at the last swing, which verifies the rationality of the stability judgment index.

In a possible embodiment, since the angular velocity of the generator is an implicit function of the mechanical power, the correction criterion f can be expressed as an implicit function of the generator power. To achieve an effective mapping between the criterion and the dynamic security region, the change of the sensitivity of the f function when the mechanical power $P_m$ changes is calculated:

$$\frac{df(\Delta\omega_{min}, D_\gamma)}{dP_m} = \frac{df(\Delta\omega_{min}, D_\gamma)}{d\Delta\omega_{min}} \square \frac{d\Delta\omega_{min}}{dP_m}$$

$$= \frac{\gamma - \Delta\omega_{min}\frac{d\gamma}{d\Delta\omega_{min}} + \Delta\omega_{min}^2 \frac{d^2\gamma}{d^2\Delta\omega_{min}}}{\left(\gamma - \Delta\omega_{min}\frac{d\gamma}{d\Delta\omega_{min}}\right)^2} \square \frac{d\Delta\omega_{min}}{dP_m}$$

when the system is stable, both $$\Delta\omega \frac{d\gamma}{d\Delta\omega} \text{ and } \Delta\omega^2 \frac{d^2\gamma}{d\Delta\omega^2}$$

in the formula tend to 0, that is, the above formula is rewritten as:

$$\frac{df(0, \gamma)}{dP_m} = \frac{1}{\gamma} \square \frac{d\Delta\omega_{min}}{dP_m} = \frac{dt}{dP_m}$$

It can be seen from this formula that the corrected multi-modal stability criterion is linearly related to the mechanical power of the generator, and an extended phase trajectory sensitivity matrix S is defined as follows:

$$S = \left[\frac{\partial f_i}{\partial P_j}\right] i \in A, j = 1, 2$$

by simplifying the sensitivity of the extended phase trajectory, it can be seen that the sensitivity matrix is a constant matrix irrelevant to measured data, and when a change in the output of the generator is $\Delta P=[\Delta P_1, \Delta P_2, \ldots \Delta P_n]$, a formula of judging the extended phase trajectory stability is as follows:

$$f_i + S\Delta P < 0$$

by introducing the upper and lower active output limits of the generator and the output limit of the balancing machine, an extended phase trajectory formula is expressed as follows:

$$-\frac{1}{f_i}\sum_{j=1}^{n}\frac{\partial f_i}{\partial P_j}\Delta P_j < 1 \quad i = 1, 2 \ldots n$$

To ensure the output balance of the actual electric power system, the output change at the balancing machine is as follows:

$$\Delta P_s = -\sum_{j=1}^{n}\Delta P_j$$

according to the change $\Delta f_i$ in the extended phase trajectory correction criterion, a sensitivity $S_j$ of the stability criterion of the generator i to the generator j is as follows:

$$s_j = \frac{\Delta f_i}{\Delta P_j} - \frac{\Delta f_i}{\Delta P_s}$$

the expression of the dominant security region of the generator i is as follows:

$$-\frac{1}{f_i}\sum_{j=1}^{n-1}\left(\frac{\partial f_i}{\partial P_j} - \frac{\partial f_i}{\partial P_s}\right)\Delta P_j < 1$$

where $f_i=[f_1, f_2, \ldots f_n]$ is a stability index of the leading generator group A, and the extended phase trajectory $f_i$ at the dominant critical point of the generator i changes the disturbance $\Delta P_j$; and $P_j$ is the injection power of all generator nodes.

The dominant security region expression of the generator i achieves an effective mapping between the extended phase trajectory correction criterion and the dynamic security region, and the upper and lower output limits of the generator and the output limit of the balancing machine are considered as shown below:

$$\begin{cases} P_j^m - P_j \le \Delta P_j \le P_j^M - P_j \\ P_s^m - P_s \le -\sum_{j=1}^{n-1} \Delta P_j \le P_s^M - P_s \end{cases}.$$

A formula of constructing a multi-modal practical dynamic security region based on the extended phase trajectory based on upper and lower output limits of the generator and an output limit of a balancing machine is as follows:

$$\begin{cases} -\frac{1}{f_i} \sum_{j=1}^{n-1} \left( \frac{\partial f_i}{\partial P_j} - \frac{\partial f_i}{\partial P_s} \right) \Delta P_j < 1 \\ P_j^m - P_j \le \Delta P_j \le P_j^M - P_j \\ P_s^m - P_s \le -\sum_{j=1}^{n-1} \Delta P_j \le P_s^M - P_s \end{cases}$$

where $P_s$ is an active output of a balancing machine group, $P_j^m$ is a lower limit of the active power of the $j^{th}$ generator, $P_j^M$ is an upper limit of the active power of the $j^{th}$ generator, $P_s^m$ is a lower limit of the active power of the balancing machine, and $P_s^M$ is an upper limit of the active power of the balancing machine.

In summary, the present disclosure acquires electric power system data, where the electric power system data comprises a power angle δ and an angular velocity difference Δω of a generator node after a fault occurs, identifies a leading generator group A through the power angle δ, and performs CCCOI-RM transformation on the angular velocity difference Δω to obtain the transformed angular acceleration γ, where if the electric power system is in transient instability when the fault duration time is t, a power angle table and an angular velocity table of the electric power system are obtained; draws an extended phase trajectory of angular velocity and angular acceleration according to the power angle table and the angular velocity table of the electric power system, divides the electric power system into a leading generator group A and a lagging generator group S according to an unstable power angle curve of the electric power system when a power angle between generators is greater than a threshold of 180°, and after the output of the generators in the leading generator group A is adjusted, performs transient simulation again until the electric power system is in the transient stability and a stable operation point $P_0$ is obtained; and increases the output of the generator i in the leading generator group A to an upper output limit of the generator i at the stable operation point $P_0$, performs transient simulation again, if the electric power system is in transient instability, searches a critical instability point by adopting a dichotomy method, and marks the critical instability point as a dominant instability critical point of the generator. For generators in the leading generator group A, output of each of the generators is changed to search for a dominant instability critical point; a reciprocal of the slope of the tangent line of a trajectory of n swings of an extended phase plane based on angular velocity-angular acceleration in a fourth quadrant is calculated according to actual measurement information to obtain a stability index for identifying single-swing instability and multi-swing instability, and a disturbance output ΔP of the generator is changed at the dominant instability critical point to solve a sensitivity of the extended phase trajectory; and a multi-modal practical dynamic security region based on the extended phase trajectory is constructed based on upper and lower output limits of the generator and an output limit of a balancing machine. The present disclosure achieves the stability judgment of the single-swing instability and multi-swing instability of the system, expands the application range compared with the traditional extended phase trajectory, and breaks through the limitation that the stability of the traditional trajectory stability judgment cannot quantify the stability margin through the combination with the security region. The present disclosure achieves an effective mapping between the correction criterion and the dynamic security region, and simultaneously construct a dynamic security region at the critical stable point by utilizing the sensitivity matrix. Compared with the traditional phase trajectory sensitivity, the stability criterion sensitivity constructed by the present disclosure has a constant coefficient characteristic that does not require measurement data, fully utilizes the margin quantization capability of a security region, obtains the linear relation between the stability criterion and the node injection power, and can achieve accurate transient stability evaluation before a fault occurs.

It should be noted that the method of the embodiments of the present disclosure may be executed by a single device, such as a computer or a server. The method of this embodiment can also be applied to a distributed scenario and is completed by the mutual cooperation of a plurality of devices. In such a distributed scenario, one of the plurality of devices may only perform one or more steps of the method of the embodiments of the present disclosure, and the plurality of devices interact with each other to complete the method.

It should be noted that some embodiments of the present disclosure are described above. Other embodiments fall within the protection scope of the appended claims. In some cases, the actions or steps stated in the claims may be performed in a sequence different from those in the embodiments and the desired result may still be achieved. In addition, the processes described in the accompanying drawings do not necessarily require the specific order or sequential order shown to achieve the desired result. In some implementations, multitasking and parallel processing are also feasible or may be advantageous.

Embodiment 2

Figure 2:
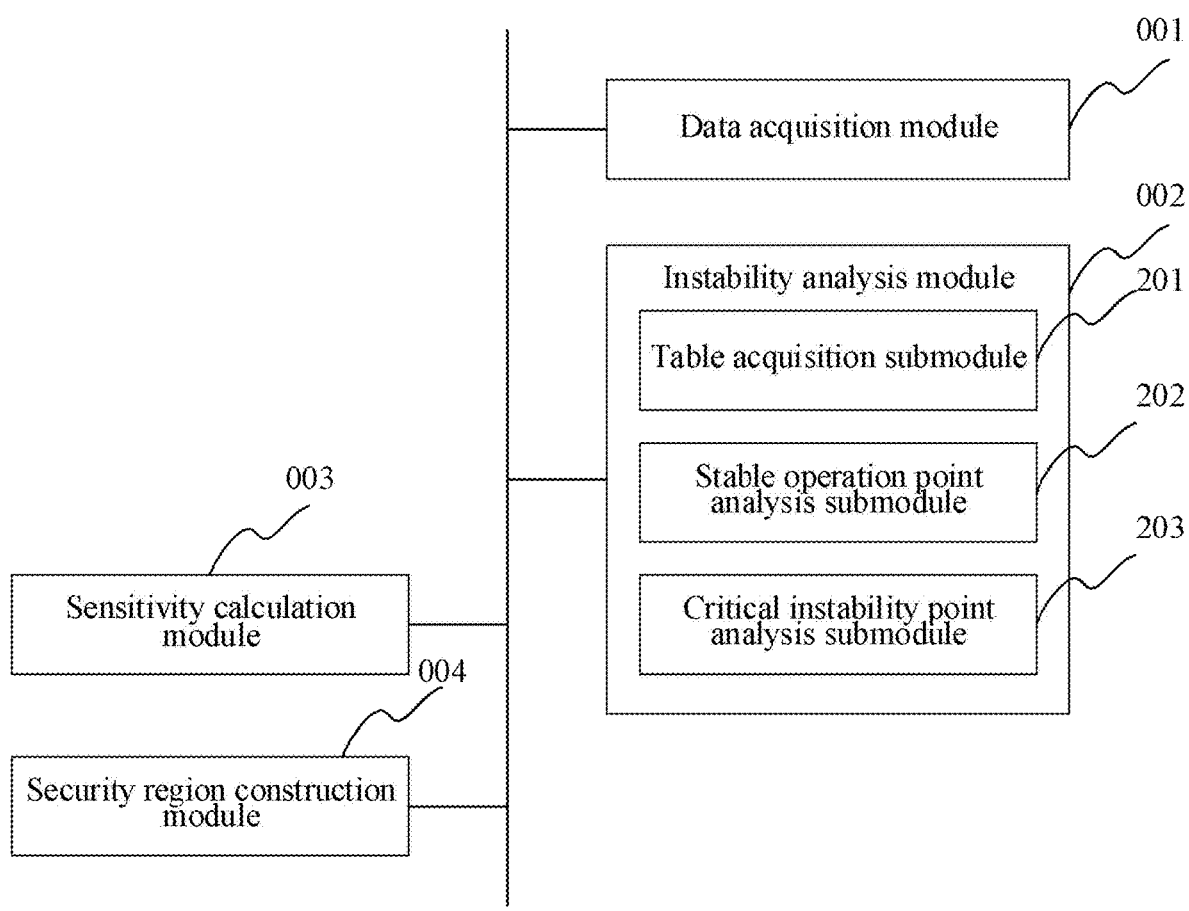
FIG. 2 is an architecture diagram of a device for constructing a dynamic security region of a power grid based on an extended phase trajectory theory according to an embodiment of the present disclosure.

Referring to FIG. 2, an embodiment of the present disclosure further provides a device for constructing a dynamic security region of a power grid based on an extended phase trajectory theory, which comprises:

a data acquisition module 001, configured to acquire electric power system data, where the electric power system data comprises a power angle δ and an angular velocity difference Δω of a generator node after a fault occurs, identify a leading generator group A through the power angle δ, and perform CCCOI-RM transformation on the angular velocity difference Δω to obtain a transformed angular acceleration γ;

an instability analysis module 002, configured to change output of each of generators in the leading generator group A to search for a dominant instability critical point;

a sensitivity calculation module 003, configured to calculate a reciprocal of the slope of the tangent line of a trajectory of n swings of an extended phase plane based on angular velocity-angular acceleration in a fourth quadrant according to actual measurement information to obtain a stability index for identifying single-swing instability and multi-swing instability, and change a disturbance output $\Delta P$ of the generator at the dominant instability critical point to solve a sensitivity of the extended phase trajectory; and a security region construction module 004, configured to construct a multi-modal practical dynamic security region based on the extended phase trajectory based on upper and lower output limits of the generator and an output limit of a balancing machine.

In this embodiment, in the data acquisition module 001, a formula of performing CCCOI-RM transformation on the angular velocity difference $\Delta\omega$ to obtain the transformed angular acceleration is as follows:

$$\begin{cases} \Delta\tilde{\omega}_i = \Delta\omega_i - \Delta\omega_{COI} \\ \Delta\omega_{COI} = \frac{1}{M_T}\sum_{i=1}^{n} M_i \Delta\omega_i \\ M_T = \sum_{i=1}^{n} M_i \end{cases}$$

where $\Delta\tilde{\omega}_i$ is an angular velocity deviation of an $i^{th}$ generator relative to COI, $\Delta\omega_i$ is an angular velocity deviation of the $i^{th}$ generator, $\Delta\omega_{COI}$ is an angular velocity deviation based on the COI, $M_T$ is a sum of inertia time constants of n generators, and $M_i$ is an inertia time constant of the $i^{th}$ generator.

In this embodiment, the instability analysis module 002 comprises:

a table acquisition submodule 201, configured to obtain a power angle table and an angular velocity table of the electric power system if the electric power system is in transient instability when the fault duration time is t;

a stable operation point analysis submodule 202, configured to draw an extended phase trajectory of angular velocity and angular acceleration according to the power angle table and the angular velocity table of the electric power system, divide the electric power system into a leading generator group A and a lagging generator group S according to an unstable power angle curve of the electric power system when a power angle between generators is greater than a threshold of 180°, and after the output of the generators in the leading generator group A is adjusted, perform transient simulation again until the electric power system is in the transient stability and a stable operation point $P_0$ is obtained; and a critical instability point analysis submodule 203, configured to increase the output of the generator i in the leading generator group A to an upper output limit of the generator i at the stable operation point $P_0$, perform transient simulation again, if the electric power system is in transient instability, search for a critical instability point by adopting a dichotomy method, and mark the critical instability point as a dominant instability critical point of the generator.

In this embodiment, in the sensitivity calculation module 003, a formula of calculating a reciprocal of the slope of the tangent line of a trajectory of n swings of an extended phase plane based on angular velocity-angular acceleration in a fourth quadrant according to actual measurement information to obtain a stability index f for identifying single-swing instability and multi-swing instability is as follows:

$$f = \max\left\{\frac{\Delta\omega^1}{D_\gamma^1} \quad \frac{\Delta\omega^2}{D_\gamma^2} \quad \cdots \quad \frac{\Delta\omega^n}{D_\gamma^n}\right\} < 0$$

where $\Delta\omega^i/D_\gamma^i$ is a negative reciprocal of the slope of the tangent line of the trajectory of the $i^{th}$ swing in the fourth quadrant, $D_\gamma$ is an intercept value of the tangent line of the trajectory of the extended phase plane in the fourth quadrant on Y axis, and the stability of the system is judged by judging the sign of f when the $i^{th}$ swing leaves the fourth quadrant;

In the sensitivity calculation module 003, the stability index f is corrected, and a formula of judging the corrected transient stability is as follows:

$$f(\Delta\omega_{min}, D_\gamma) = \frac{\Delta\omega_{min}}{\gamma - \frac{dt}{\gamma} \sqsubset \Delta\omega_{min}} = \frac{dt}{In\left(\frac{\Delta\omega_{min}}{-\gamma}\right)} < 0$$

where $\Delta\omega_{min}$ is a value of the angular velocity difference when the trajectory of the extended phase plane is currently swung out of the fourth quadrant, and $\gamma$ is the transformed angular acceleration;

in the sensitivity calculation module 003, the injection power sensitivity analysis is performed on a multi-modal instability correction criterion based on an extended phase trajectory to obtain an effective mapping between the correction criteria and node injection power, and an extended phase trajectory sensitivity matrix S is defined as follows:

$$S = \left[\frac{\partial f_i}{\partial P_j}\right] i \in A, j = 1, 2 \ldots$$

in the sensitivity calculation module 003, when a change in the output of the generator is $\Delta P = [\Delta P_1, \Delta P_2, \ldots \Delta P_n]$, a formula of judging the extended phase trajectory stability is as follows:

$$f_i + S\Delta P < 0$$

in the sensitivity calculation module 003, by introducing the upper and lower active output limits of the generator and the output limit of the balancing machine, an extended phase trajectory formula is expressed as follows:

$$-\frac{1}{f_i}\sum_{j=1}^{n}\frac{\partial f_i}{\partial P_j}\Delta P_j < 1 \quad i = 1, 2 \ldots n$$

in the sensitivity calculation module 003, a change in the output of the balancing machine is as follows:

$$\Delta P_s = -\sum_{j=1}^{n}\Delta P_j$$

in the sensitivity calculation module 003, according to the change $\Delta f_i$ in the extended phase trajectory correction criterion, a sensitivity $S_j$ of the stability criterion of the generator i to the generator j is as follows:

$$S_j = \frac{\Delta f_i}{\Delta P_j} - \frac{\Delta f_i}{\Delta P_s}$$

in the sensitivity calculation module 003, the expression of the dominant security region of the generator i is as follows:

$$-\frac{1}{f_i}\sum_{j=1}^{n-1}\left(\frac{\partial f_i}{\partial P_j} - \frac{\partial f_i}{\partial P_s}\right)\Delta P_j < 1$$

where $f_i = [f_1, f_2, \ldots f_n]$ is a stability index of the leading generator group A, and the extended phase trajectory $f_i$ at the dominant critical point of the generator i changes the disturbance $\Delta P_j$; and $P_j$ is the injection power of all generator nodes.

In this embodiment, in the security region construction module 004, a formula of constructing a multi-modal practical dynamic security region based on the extended phase trajectory based on upper and lower output limits of the generator and an output limit of a balancing machine is as follows:

$$\begin{cases} -\frac{1}{f_i}\sum_{j=1}^{n-1}\left(\frac{\partial f_i}{\partial P_j} - \frac{\partial f_i}{\partial P_s}\right)\Delta P_j < 1 \\ P_j^m - P_j \leq \Delta P_j \leq P_j^M - P_j \\ P_s^m - P_s \leq -\sum_{j=1}^{n-1}\Delta P_j \leq P_s^M - P_s \end{cases}$$

where $P_s$ is an active output of a balancing machine group, $P_j^m$ is a lower limit of the active power of the $j^{th}$ generator, $P_j^M$ is an upper limit of the active power of the $j^{th}$ generator, $P_s^m$ is a lower limit of the active power of the balancing machine, and $P_s^M$ is an upper limit of the active power of the balancing machine.

It should be noted that content such as information exchange between the modules of the device and the execution processes thereof is based on the same idea as that of the method embodiment in Embodiment 1 of the present application, and produces the same technical effects as that of the method embodiments of the present application. For specific content, refer to the foregoing descriptions in the method embodiment of the present application. Details are not described herein again.

Embodiment 3

Embodiment 3 of the present disclosure provides a non-transitory computer-readable storage medium. The computer-readable storage medium stores program codes of a method for constructing a dynamic security region of a power grid based on an extended phase trajectory theory, where the program codes comprise instructions for executing the method for constructing the dynamic security region of the power grid based on the extended phase trajectory theory according to Embodiment 1 or any possible implementations of this embodiment.

The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a solid state disk (SSD)), or the like.

Embodiment 4

Embodiment 4 of the present disclosure provides an electronic device, which comprises: a memory and a processor;

the processor and the memory are communicated with each other through a bus; the memory stores program instructions executable by the processor, and the processor calls the program instructions to be able to execute the method for constructing the dynamic security region of the power grid based on the extended phase trajectory theory according to Embodiment 1 or any possible implementations of this embodiment.

Specifically, the processor may be implemented by using hardware or software. When the processor is implemented by using hardware, the processor may be a logic circuit, an integrated circuit, or the like. When the processor is implemented by using software, the processor may be a general-purpose processor, and is implemented by reading software code stored in a memory. The memory may be integrated into the processor, or may be located outside the processor and exist independently.

All or some of the above embodiments may be implemented by software, hardware, firmware, or any combination thereof. When software is used to implement the embodiments, all or some of the embodiments may be implemented in a form of a computer program product. The computer program product includes one or more computer instructions. When the computer program instructions are loaded and executed on a computer, all or some procedures or functions in embodiments of the present disclosure are generated. The computer may be a general-purpose computer, a dedicated computer, a computer network, or another programmable apparatus. The computer instructions may be stored in a computer-readable storage medium, or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner.

It is understandable to those skilled in the art that the modules or steps of the present disclosure described above may be implemented by a general-purpose computing device, and may be centralized in a single computing device or distributed on a network composed of a plurality of computing devices. Alternatively, the modules or steps may be implemented by program codes executable by a computing device, so that the modules or steps may be stored in a storage device and executed by the computing device. In some cases, the steps shown or described can be executed in a different order than here, or these steps can be made into individual integrated circuit modules, or a plurality of modules or steps thereof may be implemented as a single integrated circuit module. Thus, the present disclosure is not limited to any specific combination of hardware and software.

Although the present disclosure has been described in detail with respect to the general description and the specific embodiments, it will be apparent to those skilled in the art that some modifications and improvements may be made based on the present disclosure. Therefore, these modifications or improvements made without departing from the spirit of the present disclosure belong to the protection scope of the present disclosure.

What is claimed is:

1. A method for constructing a dynamic security region of a power grid based on an extended phase trajectory theory, comprising:

acquiring electric power system data, wherein the electric power system data comprises a power angle δ and an angular velocity difference Δω of a generator node after a fault occurs, identifying a leading generator group A through the power angle δ, and performing Complementary Cluster Center of Inertia-Relative Motion (CCCOI-RM) transformation on the angular velocity difference Δω to obtain a transformed angular acceleration γ;

for generators in the leading generator group A, changing output of each of the generators to search for a dominant instability critical point;

calculating a reciprocal of the slope of the tangent line of a trajectory of n swings of an extended phase plane based on angular velocity-angular acceleration in a fourth quadrant according to actual measurement information to obtain a stability index for identifying single-swing instability and multi-swing instability, and changing a disturbance output ΔP of the generator at the dominant instability critical point to solve a sensitivity of the extended phase trajectory; and constructing a multi-modal practical dynamic security region based on the extended phase trajectory based on upper and lower output limits of the generator and an output limit of a balancing machine;

wherein a formula of calculating the reciprocal of the slope of the tangent line of the trajectory of n swings of the extended phase plane based on angular velocity-angular acceleration in the fourth quadrant according to actual measurement information to obtain the stability index f for identifying single-swing instability and multi-swing instability is as follows:

$$f = \max\left\{\frac{\Delta\omega^1}{D_\gamma^1}, \frac{\Delta\omega^2}{D_\gamma^2} \cdots \frac{\Delta\omega^n}{D_\gamma^n}\right\} < 0$$

wherein $\Delta\omega^i/D_\gamma^i$ is a negative reciprocal of the slope of the tangent line of the trajectory of the $i^{th}$ swing in the fourth quadrant, $D_\gamma$ is an intercept value of the tangent line of the trajectory of the extended phase plane in the fourth quadrant on γ axis, and the stability of the system is judged by judging the sign of f when the $i^{th}$ swing leaves the fourth quadrant;

the method further comprising: correcting the stability index f, wherein a formula of judging the corrected transient stability is as follows:

$$f(\Delta\omega_{min}, D_\gamma) = \frac{\Delta\omega_{min}}{\gamma - \frac{dt}{\gamma}} \sqsubset \Delta\omega_{min} = \frac{dt}{\ln\left(\frac{\Delta\omega_{min}}{-\gamma}\right)} < 0$$

wherein $\Delta\omega_{min}$ is a value of the angular velocity difference when the trajectory of the extended phase plane is currently swung out of the fourth quadrant, and γ is the transformed angular acceleration;

the method further comprising: performing injection power sensitivity analysis on multi-modal instability correction criterion based on the extended phase trajectory to obtain an effective mapping between the correction criteria and node injection power, and defining an extended phase trajectory sensitivity matrix S as follows:

$$S = \left[\frac{\partial f_i}{\partial P_j}\right] i \in A, j = 1, 2 \ldots$$

wherein when a change in the output of the generator is ΔP=[ΔP$_1$, ΔP$_2$, ... ΔP$_n$], a formula of judging the extended phase trajectory stability is as follows:

$$f_i + S\Delta P < 0$$

by introducing the upper and lower active output limits of the generator and the output limit of the balancing machine, an extended phase trajectory formula is expressed as follows:

$$-\frac{1}{f_i}\sum_{j=1}^{n}\frac{\partial f_i}{\partial P_j}\Delta P_j < 1 \quad i = 1, 2 \ldots n$$

a change in the output of the balancing machine is as follows:

$$\Delta P_s = -\sum_{j=1}^{n}\Delta P_j$$

according to a change Δf$_i$ in an extended phase trajectory correction criterion, a sensitivity S$_j$ of a stability criterion of a generator i to a generator j is as follows:

$$S_j = \frac{\Delta f_i}{\Delta P_j} - \frac{\Delta f_i}{\Delta P_s}$$

the expression of the dominant security region of the generator i is as follows:

$$-\frac{1}{f_i}\sum_{j=1}^{n-1}\left(\frac{\partial f_i}{\partial P_j} - \frac{\partial f_i}{\partial P_s}\right)\Delta P_j < 1$$

wherein f$_i$=[f$_1$, f$_2$, ... f$_n$] is a stability index of the leading generator group A, and the extended phase trajectory f$_i$ at the dominant critical point of the generator i changes the disturbance ΔP$_j$; and P$_j$ is the injection power of all generator nodes.

2. The method for constructing the dynamic security region of the power grid based on the extended phase trajectory theory according to claim 1, wherein a formula of performing CCCOI-RM transformation on the angular velocity difference Δω to obtain the transformed angular acceleration is as follows:

$$\begin{cases} \Delta\tilde{\omega}_i = \Delta\omega_i - \Delta\omega_{COI} \\ \Delta\omega_{COI} = \dfrac{1}{M_T}\sum_{i=1}^{n} M_i \Delta\omega_i \\ M_T = \sum_{i=1}^{n} M_i \end{cases}$$

wherein $\Delta\tilde{\omega}_i$ is an angular velocity deviation of an $i^{th}$ generator relative to COI, $\Delta w_i$ is an angular velocity deviation of the $i^{th}$ generator, $\Delta\omega_{COI}$ is an angular velocity deviation based on the COI, $M_T$ is a sum of inertia time constants of n generators, and $M_i$ is an inertia time constant of the $i^{th}$ generator.

3. The method for constructing the dynamic security region of the power grid based on the extended phase trajectory theory according to claim 1, wherein, for generators in the leading generator group A, the process of changing output of each of the generators to search for a dominant instability critical point is as follows:
if the electric power system is in transient instability when the fault duration time is t, obtaining a power angle table and an angular velocity table of the electric power system;
drawing an extended phase trajectory of angular velocity and angular acceleration according to the power angle table and the angular velocity table of the electric power system, dividing the electric power system into a leading generator group A and a lagging generator group S according to an unstable power angle curve of the electric power system when a power angle between generators is greater than a threshold of 180°, and after the output of the generators in the leading generator group A is adjusted, performing transient simulation again until the electric power system is in the transient stability and a stable operation point $P_0$ is obtained; and
increasing the output of the generator i in the leading generator group A to an upper output limit of the generator i at the stable operation point $P_0$, performing transient simulation again, if the electric power system is in transient instability, searching for a critical instability point by adopting a dichotomy method, and marking the critical instability point as a dominant instability critical point of the generator.

4. The method for constructing the dynamic security region of the power grid based on the extended phase trajectory theory according to claim 1, wherein a formula of constructing a multi-modal practical dynamic security region based on the extended phase trajectory based on upper and lower output limits of the generator and an output limit of a balancing machine is as follows:

$$\begin{cases} -\dfrac{1}{f_i}\sum_{j=1}^{n-1}\left(\dfrac{\partial f_i}{\partial P_j} - \dfrac{\partial f_i}{\partial P_s}\right)\Delta P_j < 1 \\ P_j^m - P_j \le \Delta P_j \le P_j^M - P_j \\ P_s^m - P_s \le -\sum_{j=1}^{n-1}\Delta P_j \le P_s^M - P_s \end{cases}$$

wherein $P_s$ is an active output of a balancing machine group, $P_j^m$ is a lower limit of the active power of a $j^{th}$ generator, $P_j^M$ is an upper limit of the active power of the $j^{th}$ generator, $P_s^m$ is a lower limit of the active power of the balancing machine, and $P_s^M$ is an upper limit of the active power of the balancing machine.

5. A device for constructing a dynamic security region of a power grid based on an extended phase trajectory theory, comprising:
a data acquisition module, configured to acquire electric power system data, wherein the electric power system data comprises a power angle δ and an angular velocity difference Δω of a generator node after a fault occurs, identify a leading generator group A through the power angle δ, and perform Complementary Cluster Center of Inertia-Relative Motion (CCCOI-RM) transformation on the angular velocity difference Δω to obtain a transformed angular acceleration γ;
an instability analysis module, configured to change output of each of generators in the leading generator group A to search for a dominant instability critical point;
a sensitivity calculation module, configured to calculate a reciprocal of the slope of the tangent line of a trajectory of n swings of an extended phase plane based on angular velocity-angular acceleration in a fourth quadrant according to actual measurement information to obtain a stability index for identifying single-swing instability and multi-swing instability, and change a disturbance output ΔP of the generator at the dominant instability critical point to solve a sensitivity of the extended phase trajectory; and
a security region construction module, configured to construct a multi-modal practical dynamic security region based on the extended phase trajectory based on upper and lower output limits of the generator and an output limit of a balancing machine;
wherein, in the sensitivity calculation module, a formula of calculating the reciprocal of the slope of the tangent line of the trajectory of n swings of the extended phase plane based on angular velocity-angular acceleration in the fourth quadrant according to actual measurement information to obtain the stability index f for identifying single-swing instability and multi-swing instability is as follows:

$$f = \max\left\{\dfrac{\Delta\omega^1}{D_\gamma^1}, \dfrac{\Delta\omega^2}{D_\gamma^2}, \ldots, \dfrac{\Delta\omega^n}{D_\gamma^n}\right\} < 0$$

wherein $\Delta\omega^i/D_\gamma^i$ is a negative reciprocal of the slope of the tangent line of the trajectory of the $i^{th}$ swing in the fourth quadrant, $D_\gamma$ is an intercept value of the tangent line of the trajectory of the extended phase plane in the fourth quadrant on γ axis, and the stability of the system is judged by judging the sign of f when the $i^{th}$ swing leaves the fourth quadrant;
in the sensitivity calculation module, the stability index f is corrected, and a formula of judging the corrected transient stability is as follows:

$$f(\Delta\omega_{min}, D_\gamma) = \dfrac{\Delta\omega_{min}}{\gamma - \dfrac{dt}{\gamma}\sqsubset\Delta\omega_{min}} = \dfrac{dt}{\ln\left(\dfrac{\Delta\omega_{min}}{-\gamma}\right)} < 0$$

wherein $\Delta\omega_{min}$ is a value of the angular velocity difference when the trajectory of the extended phase plane is currently swung out of the fourth quadrant, and $\gamma$ is the transformed angular acceleration;

in the sensitivity calculation module, the injection power sensitivity analysis is performed on a multi-modal instability correction criterion based on an extended phase trajectory to obtain an effective mapping between the correction criteria and node injection power, and an extended phase trajectory sensitivity matrix S is defined as follows:

$$S = \left[\frac{\partial f_i}{\partial P_j}\right] \quad i \in A, j = 1, 2$$

in the sensitivity calculation module, when a change in the output of the generator is $\Delta P=[\Delta P_1, \Delta P_2, \ldots \Delta P_n]$, a formula of judging the extended phase trajectory stability is as follows:

$$f_i + S\Delta P < 0$$

in the sensitivity calculation module, by introducing the upper and lower active output limits of the generator and the output limit of the balancing machine, an extended phase trajectory formula is expressed as follows:

$$-\frac{1}{f_i}\sum_{j=1}^{n}\frac{\partial f_i}{\partial P_j}\Delta P_j < 1 \quad i = 1, 2 \ldots n$$

in the sensitivity calculation module, a change in the output of the balancing machine is as follows:

$$\Delta P_s = -\sum_{j=1}^{n}\Delta P_j$$

in the sensitivity calculation module, according to a change $\Delta f_i$ in an extended phase trajectory correction criterion, a sensitivity $S_j$ of a stability criterion of a generator i to a generator j is as follows:

$$S_j = \frac{\Delta f_i}{\Delta P_j} - \frac{\Delta f_i}{\Delta P_s}$$

in the sensitivity calculation module, the expression of a dominant security region of the generator i is as follows:

$$-\frac{1}{f_i}\sum_{j=1}^{n-1}\left(\frac{\partial f_i}{\partial P_j} - \frac{\partial f_i}{\partial P_s}\right)\Delta P_j < 1$$

wherein $f_i=[f_1, f_2, \ldots f_n]$ is a stability index of the leading generator group A, and the extended phase trajectory $f_i$ at the dominant critical point of the generator i changes the disturbance $\Delta P_j$; and $P_j$ is an injection power of all generator nodes.

6. The device for constructing the dynamic security region of the power grid based on the extended phase trajectory theory according to claim 5, wherein, in the data acquisition module, a formula of performing CCCOI-RM transformation on the angular velocity difference $\Delta\omega$ to obtain the transformed angular acceleration is as follows:

$$\begin{cases} \Delta\tilde{\omega}_i = \Delta\omega_i - \Delta\omega_{COI} \\ \Delta\omega_{COI} = \frac{1}{M_T}\sum_{i=1}^{n}M_i\Delta\omega_i \\ M_T = \sum_{i=1}^{n}M_i \end{cases}$$

wherein $\Delta\tilde{\omega}_i$ is an angular velocity deviation of the $i^{th}$ generator relative to COI, $\Delta\omega_i$ is an angular velocity deviation of the $i^{th}$ generator, $\Delta\omega_{COI}$ is an angular velocity deviation based on the COI, $M_T$ is a sum of inertia time constants of n generators, and $M_i$ is an inertia time constant of the $i^{th}$ generator;

the instability analysis module comprises:

a table acquisition submodule, configured to obtain a power angle table and an angular velocity table of the electric power system if the electric power system is in transient instability when the fault duration time is t;

a stable operation point analysis submodule, configured to draw an extended phase trajectory of angular velocity and angular acceleration according to the power angle table and the angular velocity table of the electric power system, divide the electric power system into a leading generator group A and a lagging generator group S according to an unstable power angle curve of the electric power system when a power angle between generators is greater than a threshold of 180°, and after the output of the generators in the leading generator group A is adjusted, perform transient simulation again until the electric power system is in the transient stability and a stable operation point $P_0$ is obtained; and a critical instability point analysis submodule, configured to increase the output of the generator i in the leading generator group A to an upper output limit of the generator i at the stable operation point $P_0$, perform transient simulation again, if the electric power system is in transient instability, search for a critical instability point by adopting a dichotomy method, and mark the critical instability point as a dominant instability critical point of the generator.

7. The device for constructing the dynamic security region of the power grid based on the extended phase trajectory theory according to claim 5, wherein, in the security region construction module, a formula of constructing a multi-modal practical dynamic security region based on the extended phase trajectory based on upper and lower output limits of the generator and an output limit of a balancing machine is as follows:

$$\begin{cases} -\frac{1}{f_i}\sum_{j=1}^{n-1}\left(\frac{\partial f_i}{\partial P_j} - \frac{\partial f_i}{\partial P_s}\right)\Delta P_j < 1 \\ P_j^m - P_j \leq \Delta P_j \leq P_j^M - P_j \\ P_s^m - P_s \leq -\sum_{j=1}^{n-1}\Delta P_j \leq P_s^M - P_s \end{cases}$$

wherein $P_s$ is an active output of a balancing machine group, $P_j^m$ is a lower limit of the active power of the $j^{th}$ generator, $P_j^M$ is an upper limit of the active power of the $j^{th}$ generator, $P_s^m$ is a lower limit of the active power of the balancing machine, and $P_s^M$ is an upper limit of the active power of the balancing machine.

* * * * *